(12) United States Patent
Ikeda (10) Patent No.: US 8,624,261 B2
(45) Date of Patent: Jan. 7, 2014

(54) NITRIDE SEMICONDUCTOR DEVICE

(75) Inventor: Kentaro Ikeda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 13/220,005

(22) Filed: Aug. 29, 2011

(65) Prior Publication Data

US 2012/0228625 A1     Sep. 13, 2012

(30) Foreign Application Priority Data

Mar. 10, 2011  (JP) .................................. 2011-53604

(51) Int. Cl.
    *H01L 31/0256*     (2006.01)
(52) U.S. Cl.
    USPC ............. 257/76; 257/192; 257/217; 257/379; 257/E21.009; 257/E29.089
(58) Field of Classification Search
    USPC ............ 257/76, 192, 217, 379, 393, E29.001, 257/E29.089, E24.001
    See application file for complete search history.

(56) References Cited

U.S. PATENT DOCUMENTS

2005/0189561 A1* 9/2005 Kinzer et al. ................. 257/192

FOREIGN PATENT DOCUMENTS

| JP | 60-194825 A | 10/1985 |
|---|---|---|
| JP | 63-87770 A | 4/1988 |
| JP | 63-234622 A | 9/1988 |
| JP | 63-285022 A | 11/1988 |
| JP | 1-105612 A | 4/1989 |
| JP | 1-175335 A | 7/1989 |
| JP | 6-5221 U | 1/1994 |
| JP | 6-85250 A | 3/1994 |
| JP | 7-321621 A | 12/1995 |
| JP | 8-264762 A | 10/1996 |
| JP | 2002-290224 | 10/2002 |
| JP | 2005-176298 | 6/2005 |
| JP | 2007-228299 A | 9/2007 |
| JP | 2007-324363 A | 12/2007 |
| JP | 2008-252436 A | 10/2008 |
| WO | WO 2008/096521 A1 | 8/2008 |

OTHER PUBLICATIONS

Kikkawa et al. ("Development of High-efficiency GaN-HEMT Amplifier for Mobile WiMAX", Fujistu Sci. Tech. J., 44, 3, pp. 333-339, Jul. 2008).*

Decision of Refusal issued Jan. 9, 2013 in Japanese Patent Application No. 2011-053604 (with English translation).

Office Action issued Oct. 19, 2012 in Japanese Patent Application No. 2011-053604 with English language translation.

* cited by examiner

*Primary Examiner* — Yasser Abdelaziez (74) *Attorney, Agent, or Firm* — Oblon, Spivak, McClelland, Maier & Neustadt, L.L.P.

(57) ABSTRACT

According to one embodiment, a nitride semiconductor device includes a first, a second, a third and a fourth transistor of n-type channel and a resistor. The first transistor has a first gate, a first source, and a first drain. The second transistor has a second gate, a second source electrically connected to the first gate, and a second drain. The third transistor has a third gate, a third source electrically connected to the first source, and a third drain electrically connected to the first gate and the second source. The fourth transistor has a fourth gate electrically connected to the third gate, a fourth source electrically connected to the first source and the third source, and a fourth drain electrically connected to the second gate. The resistor has one end electrically connected to the second drain and one other end electrically connected to the second gate and the fourth drain.

19 Claims, 7 Drawing Sheets

NITRIDE SEMICONDUCTOR DEVICE

CROSS-REFERENCE TO RELATED APPLICATIONS

This application is based upon and claims the benefit of priority from the prior Japanese Patent Application No. 2011-053604, filed on Mar. 10, 2011; the entire contents of which are incorporated herein by reference.

FIELD

Embodiments described herein relate generally to a nitride semiconductor device.

BACKGROUND

Semiconductor devices using a wide-gap semiconductor such as GaN, SiC, diamond, ZnO and the like are characterized by high breakdown voltage, low resistance and a high-speed operation as compared with a semiconductor device using Si. Particularly, since a HEMT (High Electron Mobility Transistor) having an AlGaN/GaN heterostructure has high electron mobility and carrier density, high-frequency performances are favorable and ON resistance is low.

When this type of high-speed switching elements are to be actually used, high performance of a driving circuit which drives the high-speed switching element is desirable, but such a driving circuit cannot be necessarily obtained in actuality.

DETAILED DESCRIPTION

In general, according to one embodiment, a nitride semiconductor device includes a first transistor of n-type channel, a second transistor of n-type channel, a third transistor of n-type channel, a fourth transistor of n-type channel and a resistor. The first transistor has a first gate, a first source, and a first drain and includes a nitride semiconductor. The second transistor has a second gate, a second source electrically connected to the first gate, and a second drain. The second transistor includes a nitride semiconductor. The third transistor has a third gate, a third source electrically connected to the first source, and a third drain electrically connected to the first gate and the second source. The third transistor includes a nitride semiconductor. The fourth transistor has a fourth gate electrically connected to the third gate, a fourth source electrically connected to the first source and the third source, and a fourth drain electrically connected to the second gate. The fourth transistor includes a nitride semiconductor. The resistor has one end electrically connected to the second drain and one other end electrically connected to the second gate and the fourth drain.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

(First Embodiment)

Figure 1:
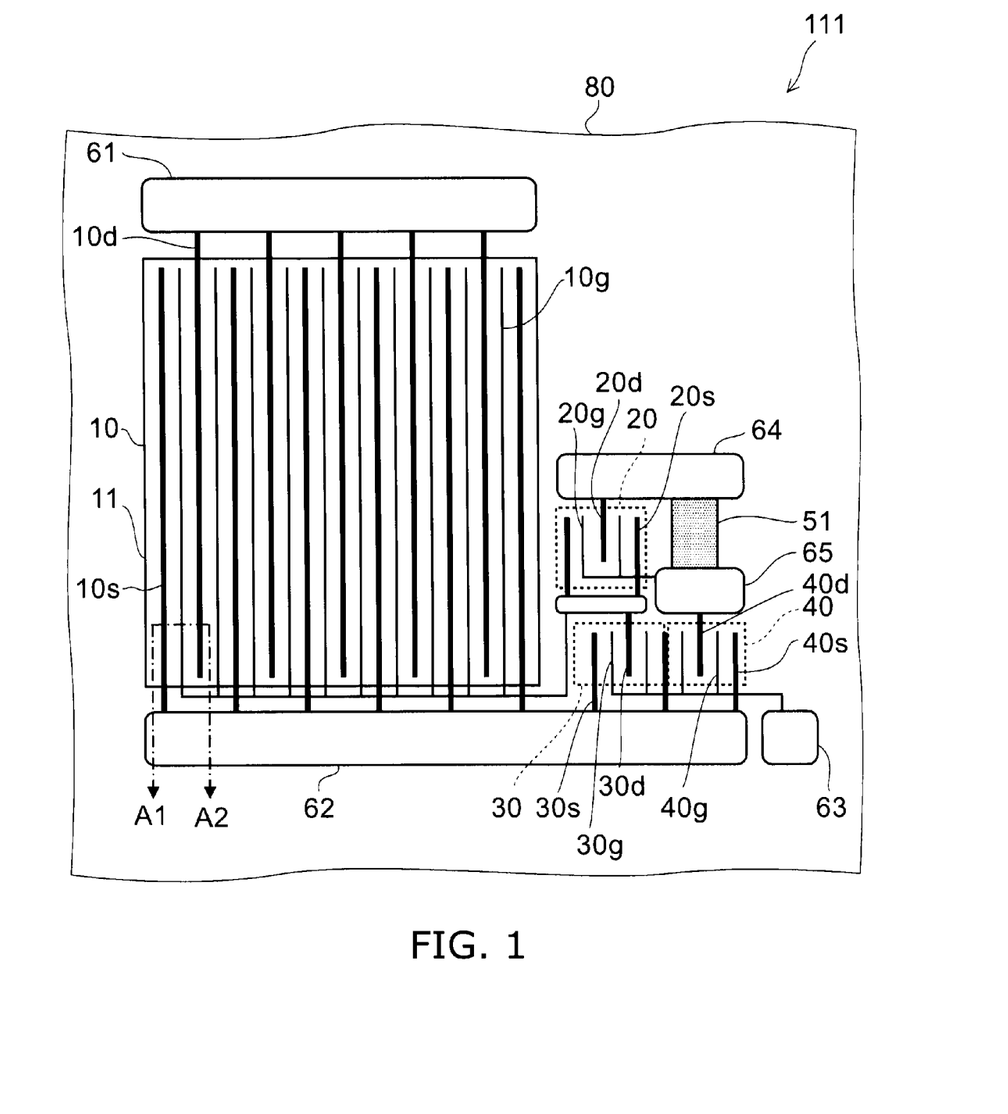
FIG. 1 is a schematic view illustrating the configuration of a nitride semiconductor device according to a first embodiment.

FIG. 1 is a schematic view illustrating a configuration of a nitride semiconductor device according to a first embodiment.

The figure schematically illustrates an example of a pattern layout of a nitride semiconductor device 111 according to the embodiment.

Figure 2:
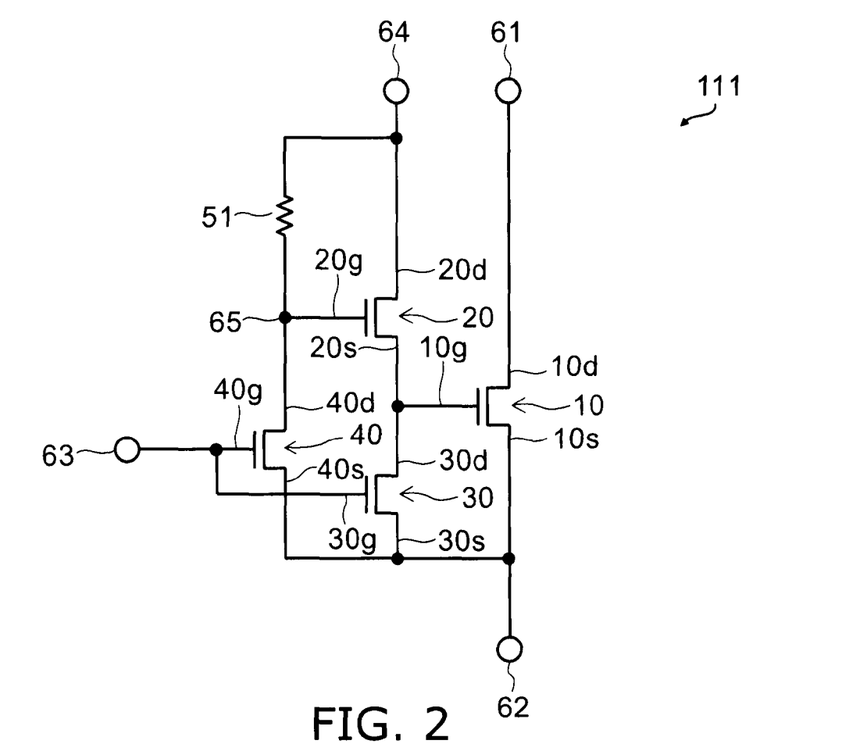
FIG. 2 is a circuit diagram illustrating the configuration of the nitride semiconductor device according to the first embodiment.

FIG. 2 is a circuit diagram illustrating a configuration of the nitride semiconductor device according to the first embodiment.

As illustrated in FIG. 1 and FIG. 2, the nitride semiconductor device 111 according to the embodiment is provided with first to fourth transistors 10, 20, 30, and 40 and a resistor 51.

The first to fourth transistors 10, 20, 30, and 40 are n-type channel transistors containing nitride semiconductors. That is, in the nitride semiconductor device 111, a circuit is formed from transistors having an n-type channel.

The first transistor 10 has a first gate 10g, a first source 10s, and a first drain 10d.

The second transistor 20 has a second gate 20g, a second source 20s, and a second drain 20d. The second source 20s is electrically connected to the first gate 10g.

The third transistor 30 has a third gate 30g, a third source 30s, and a third drain 30d. The third source 30s is electrically connected to the first source 10s. The third drain 30d is electrically connected to the first gate 10g and the second source 20s.

The fourth transistor 40 has a fourth gate 40g, a fourth source 40s, and a fourth drain 40d. The fourth gate 40g is electrically connected to the third gate 30g. The fourth source 40s is electrically connected to the first source 10s and the third source 30s. The fourth drain 40d is electrically connected to the second gate 20g.

One end of the resistor 51 is electrically connected to the second drain 20d. The other end of the resistor 51 is electrically connected to the second gate 20g and the fourth drain 40d.

In this example, the nitride semiconductor device 111 is further provided with a drain electrode pad 61, a source electrode pad 62, a gate electrode pad 63, a power-supply electrode pad 64, and a conductive portion 65.

The drain electrode pad 61 is electrically connected to the first drain 10d. The source electrode pad 62 is electrically connected to the first source 10s, the third source 30s, and the fourth source 40s. The gate electrode pad 63 is electrically connected to the fourth gate 40g and the third gate 30g. The power-supply electrode pad 64 is electrically connected to the second drain 20d and the one end of the resistor 51. The conductive portion 65 is electrically connected to the second gate 30g, the fourth drain 40d, and the other end of the resistor 51.

As a result, if a gate signal to the nitride semiconductor device 111 is not at a high speed, if output impedance of a gate driving circuit is high, and if an influence of wiring inductance is worried, high-speed switching becomes possible. That is, a nitride semiconductor device capable of a high-speed operation that is easy to be used with a smaller demand for a driving circuit can be provided.

According to the examination by the inventor, when a high-speed switching element is to be actually used, it is desirable that performances of the driving circuit that drives the high-speed switching element are high, but it was known that such a driving circuit cannot be obtained in some cases in actuality. For example, it is desirable that a gate driving circuit that drives the high-speed switching element, and wiring can address the high-speed operation and output impedance is low. However, in actuality, such a configuration cannot be obtained in some cases. Thus, a GaN element capable of high-speed switching is in demand even if the wiring inductor or output impedance is high and a high-speed signal cannot be obtained.

According to the embodiment, high-speed switching can be ensured in such a case.

The example of the specific configuration of the nitride semiconductor device 111 will be further described. Since the configurations of the first to fourth transistors 10, 20, 30, and 40 can be considered to be the same, the example of the first transistor 10 will be described below.

Figure 3:
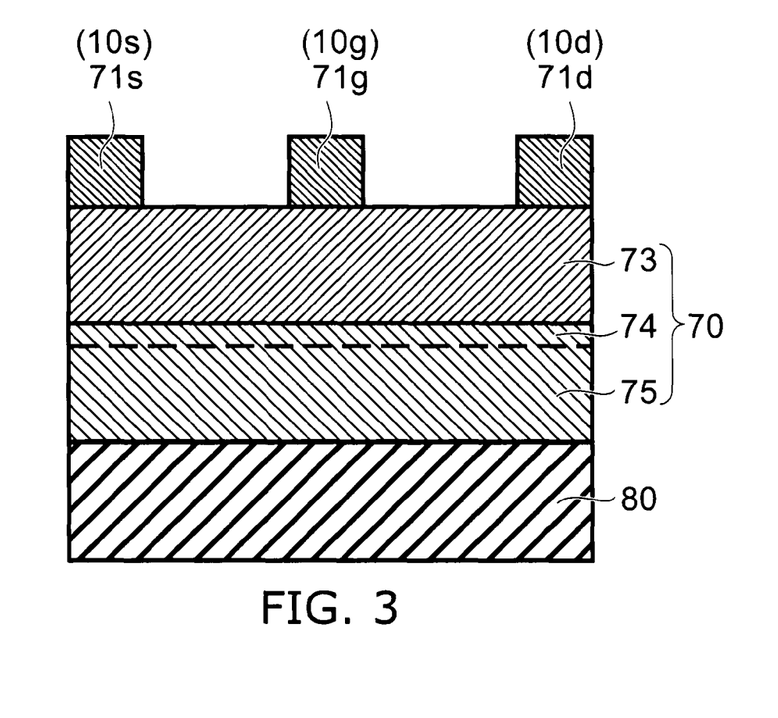
FIG. 3 is a schematic sectional view illustrating the configuration of a part of the nitride semiconductor device according to the first embodiment.

FIG. 3 is a schematic sectional view illustrating a configuration of a part of the nitride semiconductor device according to the first embodiment.

The figure is an A1-A2 line sectional view of FIG. 1. That is, the figure illustrates an example of the configuration of the first transistor 10. As illustrated in FIG. 3, in the nitride semiconductor device 111, a nitride semiconductor layer 70 is provided. The nitride semiconductor layer 70 includes a first layer 75 of GaN and a second layer 73 of $In_xAl_yGa_{1-x-y}N$ ($0 \le x < 1$, $0 < y < 1$). The second layer 73 is an AlGaN layer, for example. The second layer 73 is disposed on the first layer 75.

The first layer 75 is a carrier running layer, for example. The second layer 73 is an electron induction layer, for example. The heterostructure is formed by the first layer 75 made of a GaN material and the second layer 73 made of an AlGaN material.

Figure 4:
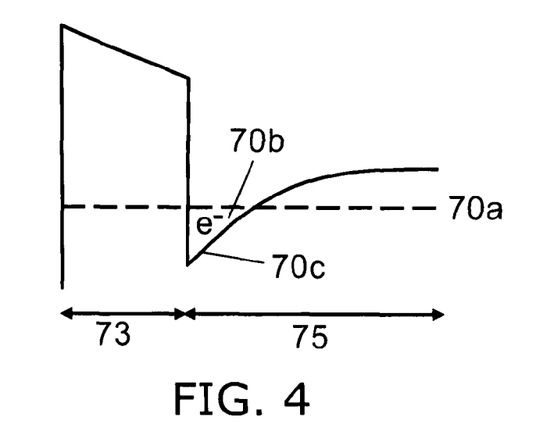
FIG. 4 is a schematic view illustrating the characteristic of the nitride semiconductor device according to the first embodiment.

FIG. 4 is a schematic view illustrating a characteristic of the nitride semiconductor device according to the first embodiment.

That is, the figure illustrates an energy state in the nitride semiconductor layer 70. In the heterojunction of the first layer 75 (the carrier running layer, for example) and the second layer 73 (the electron induction layer, for example), a well 70c having an energy level lower than that of a Fermi level 70a is formed on an interface between the first layer 75 and the second layer 73. The well 70c is a quantum well distributed in a planar state, for example. This well 70c has an energy level lower than that of the Fermi level 70a. Thus, a channel by an electron is formed. The electron of the well 70c is referred to as a two-dimensional electron gas 70b. Mobility of the electron in this channel (the two-dimensional electron gas 70b) is extremely high. The nitride semiconductor having the heterojunction uses this two-dimensional electron gas 70b as a channel.

As illustrated in FIG. 3, a two-dimensional electron gas channel 74 formed in the nitride semiconductor layer 70 is used. A large quantity of electrons are present in this two-dimensional electron gas channel 74, and the two-dimensional electron gas channel 74 becomes an electric current path. By disposing a source electrode 71s (first to fourth sources 10s, 20s, 30s, and 40s, for example), a gate electrode 71g (first to fourth gates 10g, 20g, 30g, and 40g, for example), and a drain electrode 71d (first to fourth drains 10d, 20d, 30d, and 40d, for example) on this heterostructure, the first to fourth transistors 10, 20, 30, and 40 are formed.

As described above, the nitride semiconductor device 111 is further provided with the nitride semiconductor layer 70, and the first, second, third and fourth transistors use a part of the nitride semiconductor layer 70 as a channel.

That is, each of the channels contained in each of the first, second, third, and fourth transistors 10, 20, 30, and 40 is disposed inside the nitride semiconductor layer 70 (specifically, the two-dimensional electron gas channel 74).

For example, the nitride semiconductor layer 70 is disposed on a substrate 80. That is, the nitride semiconductor layer 111 is further provided with a substrate 80 having a heterojunction, and the first, second, third, and fourth transistors 10, 20, 30, and 40 are disposed on the substrate 80.

In the nitride semiconductor device 111 illustrated in FIG. 1 and FIG. 2, the first to fourth transistors 10, 20, 30, and 40 and the resistor 51 are formed on one wafer (substrate 80), for example, so as to have a configuration of one chip. The nitride semiconductor device 111 can be handled as a four-terminal element when seen from the outside. That is, the drain electrode pad 61 can be used as a drain terminal, the source electrode pad 62 can be used as a source terminal, the gate electrode pad 63 can be used as a gate terminal, and the power-supply electrode pad 64 can be used as a power-supply terminal. That is, a supply voltage (a voltage of a power supply of the system, for example) is supplied (applied) to the power-supply electrode pad 64.

An example of an operation of the nitride semiconductor device 111 will be described below by referring to FIG. 2.

In a state in which a supply voltage is being supplied to the power-supply electrode pad 64, when a low-level signal is inputted to the gate terminal (gate electrode pad 63), the third transistor 30 and the fourth transistor 40 are turned off. Thus, a high voltage is applied to the second gate 20g of the second transistor 20 through the resistor 51. Then, the second transistor 20 enters the ON state. As a result, the power supply and the first gate 10g of the first transistor 10 are connected to each other by low impedance at such a degree of ON resistance of the second transistor 20. As a result, the first gate 10g of the first transistor 10 is rapidly charged. That is, the first transistor 10 can be brought into the ON state at a high speed.

On the other hand, when a high-level signal is inputted to the gate terminal, the third transistor 30 and the fourth transistor 40 enter the ON state, a voltage between the second gate 20g and the second source 20s of the second transistor 20 becomes 0 V, and the second transistor 20 enters the OFF state. As a result, the first gate 10g of the first transistor 10 is discharged rapidly through the third transistor 30 in the ON state. As a result, the first transistor 10 can be brought into the OFF state at a high speed.

The characteristic of the operation of the nitride semiconductor device 111 according to the embodiment will be described in comparison with a nitride semiconductor device of a reference example. In the nitride semiconductor device in the reference example, the first transistor 10 is provided, and the second to fourth transistors 20, 30, and 40 and the resistor 51 are not provided.

Figure 5:
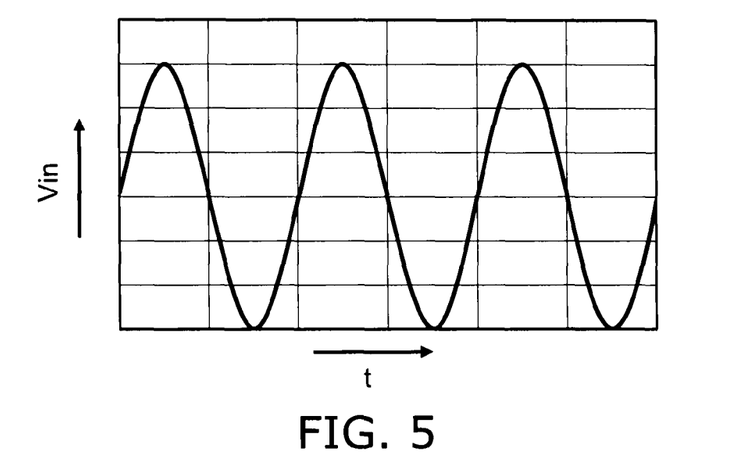
FIG. 5 and FIG. 6 are schematic views illustrating the operation of the nitride semiconductor device.
Figure 6:
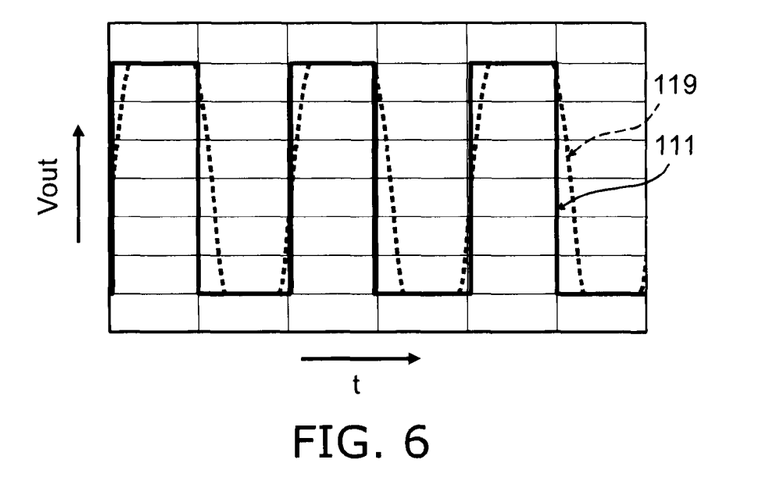

FIG. 5 and FIG. 6 are schematic views illustrating an operation of the nitride semiconductor device.

These figures illustrate a result of simulation of the characteristics of the nitride semiconductor device according to the embodiment and a nitride semiconductor device 119 in the reference example. FIG. 5 illustrates an input signal into these nitride semiconductor devices. FIG. 6 illustrates an output signal (a signal waveform of a drain current) of these nitride semiconductor devices. The horizontal axes of these figures indicate time t. The vertical axis in FIG. 5 indicates a voltage Vin of the input signal. The vertical axis in FIG. 6 indicates a voltage Vout of the output signal.

As illustrated in FIG. 5, in this simulation, a sinusoidal wave is used as an input signal. A state in which the gate signals inputted into the gate terminals of the nitride semiconductor devices 111 and 119 are not operated at a high speed, a state in which output impedance of the gate driving circuit is high, and a state in which an influence of wiring inductance is worried are assumed. That is, a state in which high-speed properties of a circuit that drives the nitride semiconductor device are extremely obstructed is assumed.

As illustrated in FIG. 6, in the nitride semiconductor device 119 in the reference example, the output signal has a trapezoidal shape. During switching of the nitride semiconductor device, it is desirable that the output signal (drain current waveform) is a rectangular wave, but distortion occurs in the waveform in the case of the sinusoidal input, and switching is not operated at a high speed. If switching is not operated at a high speed, a loss of an element is increased.

On the other hand, as illustrated in FIG. 6, in the nitride semiconductor device 111 according to the embodiment, the output signal (drain current waveform) is a substantially rectangular wave even if the input signal is a sinusoidal wave. That is, a difference between ON and OFF is clear.

As described above, in the nitride semiconductor device 111 according to the embodiment, even if the gate signal inputted into the gate terminal is not operated at a high speed, even if the output impedance of the gate driving circuit is high, and even if the influence of wiring inductance is worried, switching can be operated at a high speed.

In the embodiment, a circuit that operates at a high speed is obtained as above by an n-type channel transistor without using a p-type channel. A p-type channel transistor is usually used in a gate driving circuit. However, in a nitride semiconductor device, it is extremely difficult to form a p-type channel transistor in practice. In the embodiment, by using the above-mentioned configuration, a driving circuit is formed by an n-type channel transistor without using a p-type channel transistor, which is highly practical.

In the nitride semiconductor device 111, most of electric power required for driving of the first transistor 10 is supplied from a power-supply terminal. Thus, a load of the gate driving circuit disposed outside may be extremely small, and output impedance of the gate driving circuit may be high.

Moreover, in the embodiment, it is only necessary to apply only a small amount of electric power from the gate driving circuit to the nitride semiconductor device 111. Thus, an electric current (gate driving current) flowing between the gate driving circuit and the nitride semiconductor device 111 can be made small. Since inductance depends on the size of the electric current, the influence of wiring inductance can be suppressed by making the gate driving current small.

Examples of the size of each transistor in the embodiment will be described below. The size of the first transistor 10 will be described below.

Figure 7:
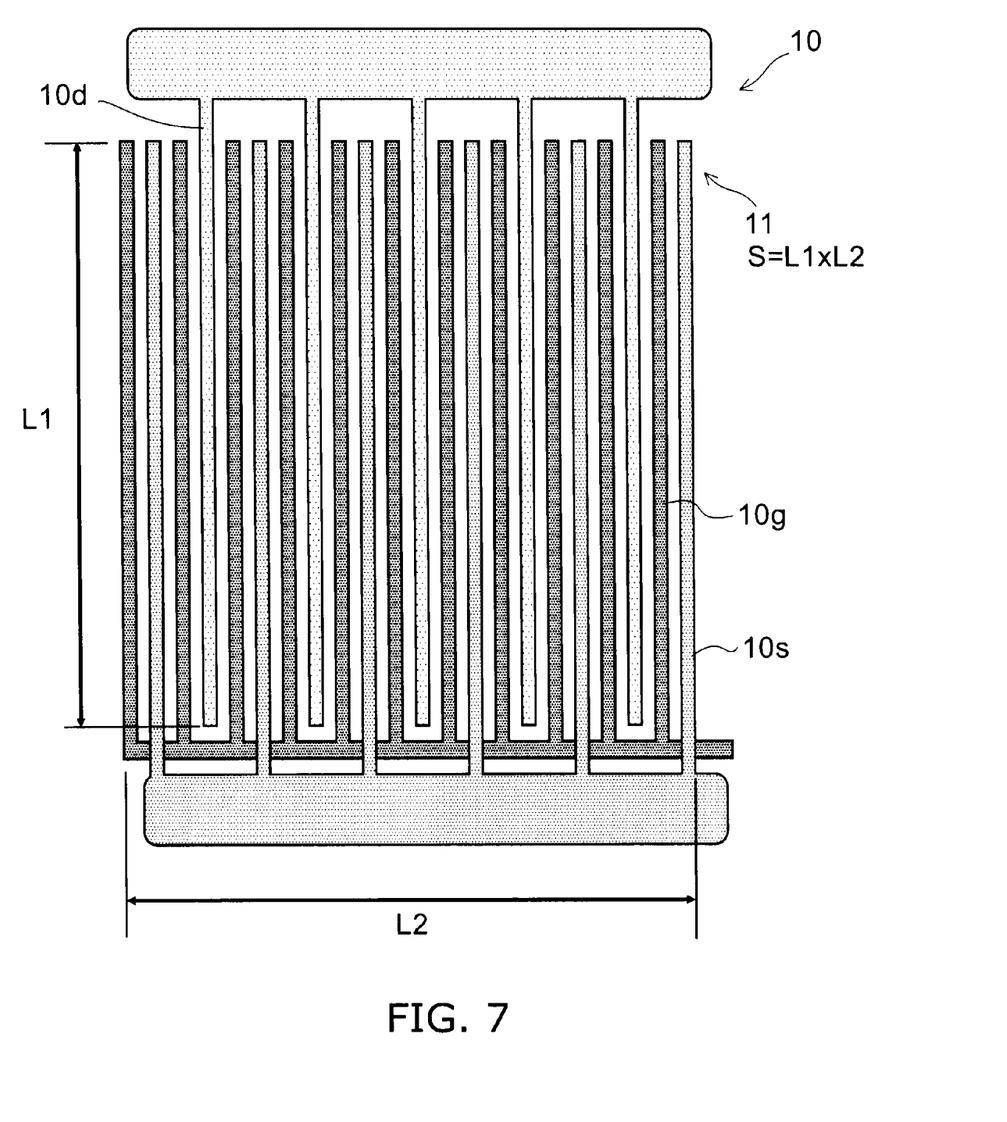
FIG. 7 is a schematic plan view illustrating the configuration of the nitride semiconductor device.

FIG. 7 is a schematic plan view illustrating a configuration of the nitride semiconductor device.

As illustrated in FIG. 7, an area S (size) of the first transistor 10 is assumed to be an area of an active portion 11.

The active portion 11 is a portion where the operation of the transistor is substantially performed. As illustrated in FIG. 7, it is assumed that the product of a length L1 and a width L2 of a portion where the source (the first source 10s) and the drain (the first drain 10d) oppose each other through the gate (the first gate 10g) is the area S. As in this example, if the source has a plurality of portions, the drain has a plurality of portions and they are combined in the comb state, the length including the source or drain on one end and the source or drain on the other end is assumed to be the width L2.

The areas of the second to fourth transistors 20, 30, and 40 are also defined similarly.

From the viewpoints of a cost and yield, the smaller the area the transistors occupy in a chip, the better the performances become. However, if the area of the transistor is reduced excessively, ON resistance becomes larger, which lowers driving capability.

If the areas of the second to fourth transistors 20, 30, and 40 are excessively small, for example, it becomes difficult to drive the first transistor 10 sufficiently at a high speed. If the areas of the second to fourth transistors 20, 30, and 40 are increased so as to reduce the ON resistance, though the first transistor 10 can be driven at a high speed, a cost is increased, and a yield is lowered. Moreover, an input capacity of the nitride semiconductor device 111 is increased. That is, it becomes difficult to drive the nitride semiconductor device 111 with a low-impedance signal source.

In the embodiment, there can be appropriate areas (sizes) for the second to fourth transistors 20, 30, and 40.

First, in order to drive the first transistor 10 at a high speed, a mirror period needs to be made short. The mirror period corresponds to charging or discharging time of gate input capacity at a threshold voltage of the transistor.

Figure 8:
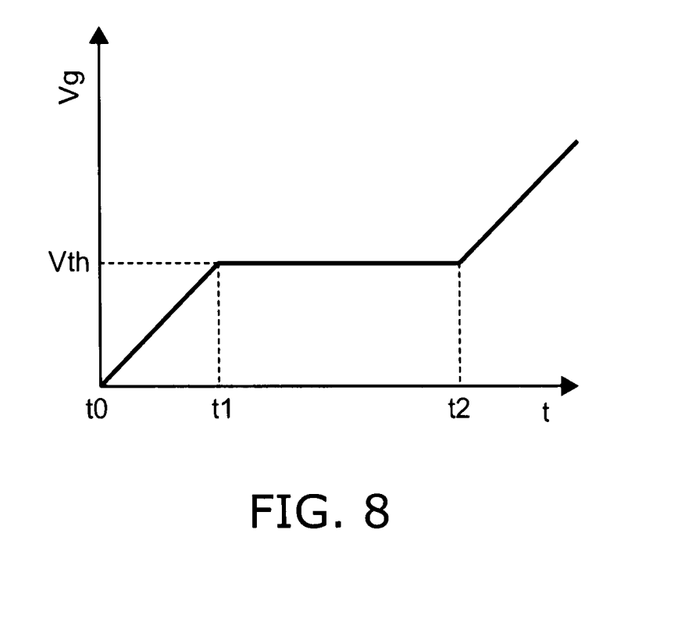
FIG. 8 is a schematic view illustrating the operation of the nitride semiconductor device.

FIG. 8 is a schematic view illustrating an operation of the nitride semiconductor device.

The figure illustrates the operation of the transistor of the nitride semiconductor. The horizontal axis indicates time t. The vertical axis indicates a gate voltage Vg.

As illustrated in FIG. 8, if the gate voltage Vg of the transistor is gradually raised from an initial time t0 to a first time t1, the gate voltage Vg is raised. When the gate voltage Vg reaches a threshold voltage Vth of the transistor, the gate voltage Vg does not rise for a certain period (a period from the first time t1 to a second time t2).

That is because, since the gate voltage Vg of the transistor has reached the threshold value Vth, the drain voltage is changed in synchronization with start of flowing of the drain current, and this voltage change creeps into the gate voltage Vg through a parasitic capacity of the transistor. In order for the transistor to operate at a high speed, this mirror period should be short. An electric charge amount required to go out of this mirror period is referred to as "Qgd". To give this Qgd quickly to the gate enables a high-speed operation of the transistor.

Assume that the mirror period is Δt (Δt=t2−t1 in the example in FIG. 8). The voltage to be applied to the power-supply electrode pad 64 of the nitride semiconductor device 111 is assumed to be Vin1. The threshold voltage of the first transistor 10 is assumed to be Vth1. Moreover, it is assumed that ΔV=Vin1−Vth1. An index RonQgd (having the dimension of Ω·C) of performances of the transistor not depending on the area of the transistor is used. The area of the first transistor 10 is assumed to be A10, and the area of the third transistor 30 is assumed to be A30. The area ratio R13 of these transistors is expressed as follows:

$$R13 = A30/A10 = RonQgd/(\Delta V \cdot \Delta t)$$

RonQgd is changed by the breakdown voltage of the transistor, for example, and is approximately 0.05 nΩC or more and 0.5 nΩC or less.

Since Vin1 is the voltage determined by a user, ΔV is also determined by the user. As a practical range, an appropriate value of ΔV is 1 V or more and 20 V or less. On the other hand, a practically useful value of Δt is 1 ns or more and 50 ns or less.

By using these appropriate constants, it results in $R13 = A30/A10 = 5 \times 10^{-5}$ to $5 \times 10^{-1}$. Similarly, the area ratio of the second transistor 20 and the fourth transistor 40 can be set.

That is, it is desirable that a ratio of the area of the active portion of the second transistor 20, the area of the active portion of the third transistor 30, and the area of the active portion of the fourth transistor 40 to the area of the active portion of the first transistor 10 is $5 \times 10^{-5}$ or more and $5 \times 10^{-1}$ or less. As a result, more appropriate driving with a shorter mirror period can be obtained.

However, the above-mentioned value (area ratio) is the area ratio when the third transistor 30 is formed with the same breakdown voltage as that of the first transistor 10. Since it is only necessary that the breakdown voltage of the third transistor 30 can withstand the input voltage of Vin1, the design does not necessarily have to be the same as that of the first transistor 10. That is, the area of the third transistor 30 may be smaller than the value of the above-mentioned area ratio. Moreover, the third transistor 30, the fourth transistor 40, and the second transistor 20 do not necessarily have to have the same area. Particularly, the fourth transistor 40 may have the same area as or a smaller area than that of the third transistor 30 and the second transistor 20.

The area of the active portion of the fourth transistor 40 is not more than the area of the active portion of the second transistor 20 or not more than the area of the active portion of the third transistor 30. As a result, the area of the fourth transistor 40 can be reduced appropriately while the appropriate driving characteristics are maintained, and an increase in a cost, a decline in yield and an increase in an input capacity can be suppressed.

The area of the transistor can be acquired on the basis of an image of an electrode of the nitride semiconductor device by using a microscope, for example.

In the embodiment, a resistor formed by working a conductive thin film such as a metal thin film into an appropriate shape can be used for the resistor 51. Also, the two-dimensional electron gas 70b (two-dimensional electron gas channel 74) may be used for the resistor 51.

Figure 9:
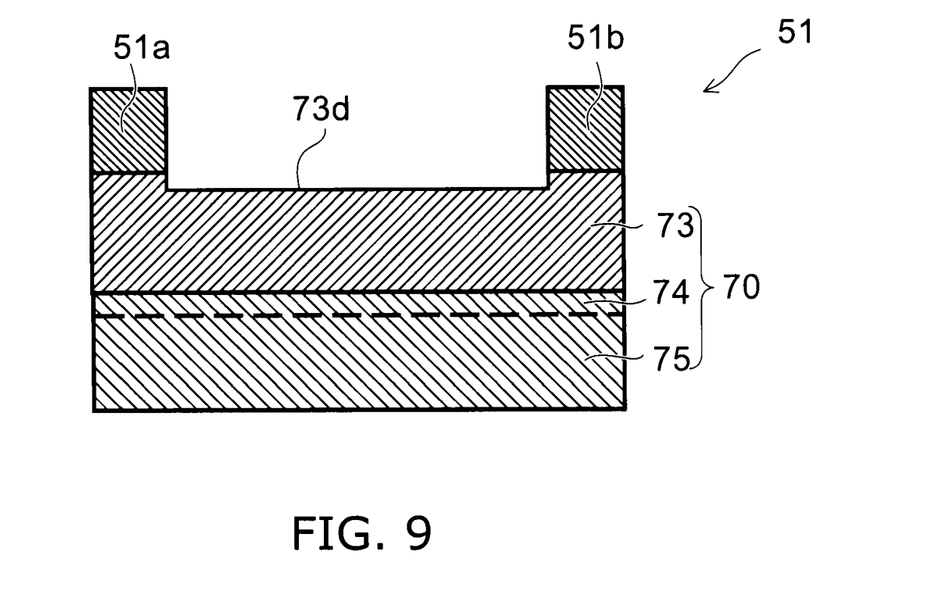
FIG. 9 is a schematic sectional view illustrating the configuration of a part of the nitride semiconductor device according to the first embodiment.

FIG. 9 is a schematic sectional view illustrating a configuration of a part of the nitride semiconductor device according to the first embodiment.

That is, the figure illustrates the configuration of the resistor 51.

As illustrated in FIG. 9, on the second layer 73 of the nitride semiconductor layer 70, an electrode 51a and an electrode 51b are provided. These electrodes form ohmic contact with the second layer 73. That is, the electrode 51a and the electrode 51b are electrically connected to the two-dimensional electron gas channel 74 through ohmic contact.

As illustrated in FIG. 9, a recess 73d is disposed in the second layer 73, and by changing the depth (recess amount) of the recess 73d, resistance of the two-dimensional electron gas channel 24 can be changed. By using this, the resistor 51 having an appropriate resistance value can be formed.

As described above, in the embodiment, the nitride semiconductor layer 70 including the first layer 75 and the second layer 73 may be provided, and the resistor 51 may include a part of the nitride semiconductor layer 70 (specifically, the two-dimensional electron gas channel 74).

As compared with use of a metal thin film as the resistor 51, if the two-dimensional electron gas channel 74 is used, a change in the resistance value caused by a temperature change is small. Thus, use of the two-dimensional electron gas 70b as the resistor 51 is more desirable.

In the embodiment, an example of the configuration of the nitride semiconductor device 111 is described by using FIG. 1, but the layout of elements included in the nitride semiconductor device 111 is not limited to the example illustrated in FIG. 1 but arbitrary.

Also, in the above, use of the configuration of GaN-HEMT illustrated in FIG. 3 is described as the nitride semiconductor device 111, but the embodiment is not limited to that example. Also, a composition ratio or a dopant may be changed in various ways in the semiconductor material to be used.

In the nitride semiconductor device 111, as a voltage to be applied to the power-supply terminal (supply voltage), 3 V or more and 20 V or less, for example, is appropriate. However, the embodiment is not limited to that, and the supply voltage is arbitrary. The supply voltage is changed as appropriate depending on the condition of the system side on which the nitride semiconductor device 111 is used and the like. If the supply voltage exceeds 20 V, the area of the transistor is enlarged due to the higher breakdown voltage of each transistor, and power consumption is also increased.

In general, output impedance tends to be larger in a high-speed circuit. In the high-speed circuit, it becomes difficult to drive a capacitive load such as driving of a field effect transistor (FET). If the output impedance is large, charging/discharging of the capacitive load becomes slow, and driving of the FET also becomes slow in the end.

Also, a wiring inductor is physically present between the gate of the FET and the gate driving circuit. The wiring inductor causes ringing in the gate of the FET and might break the FET. Also, the inductance delays a gate signal and slows the driving of the FET.

Such a phenomenon becomes more remarkable as the signal moves at a higher speed. Thus, if a GaN element for which application in a high-speed switching circuit is expected is to be used, these problems come to the fore.

As a method of solving these problems, formation of an auxiliary driving circuit to be connected to a gate of the FET on the same wafer as the FET can be considered. However, a p-type semiconductor is difficult to be controlled in GaN, and it is difficult to form a p-type channel FET. Particularly, it is extremely difficult to realize a p-type channel FET in GaN-HEMT. In general, a method of combining a p-type channel FET and an n-type channel FET is used for an FET driving circuit, but it is difficult to apply this method to GaN as described above.

In the embodiment, a p-type channel transistor is not used but the driving circuit is formed by an n-type channel transistor, and its utility is high.

(Second Embodiment)

Figure 10:
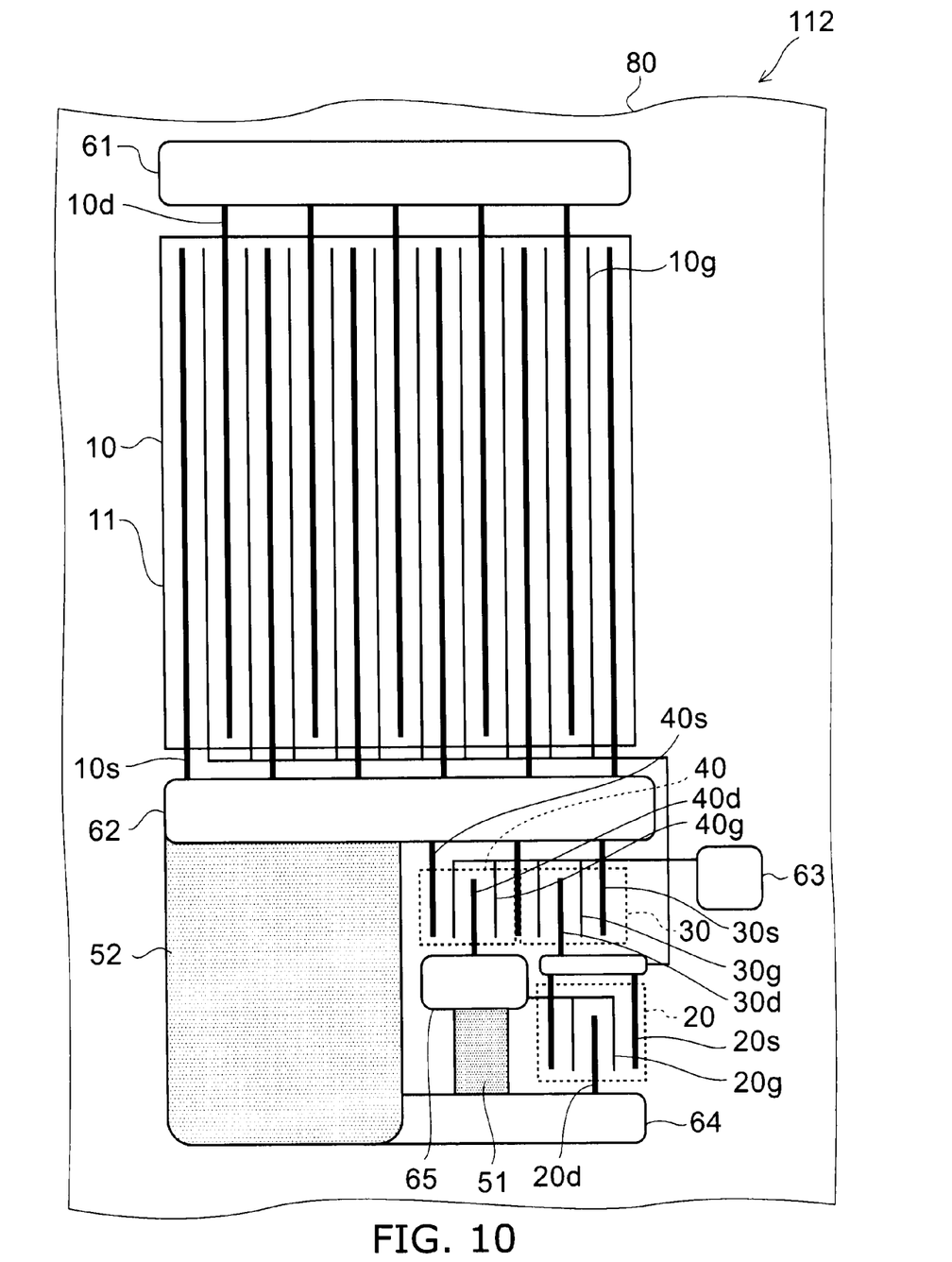
FIG. 10 is a schematic view illustrating the configuration of a nitride semiconductor device according to a second embodiment.

FIG. 10 is a schematic view illustrating a configuration of a nitride semiconductor device according to a second embodiment.

The figure schematically illustrates an example of a pattern layout of a nitride semiconductor device 112 according to the embodiment.

Figure 11:
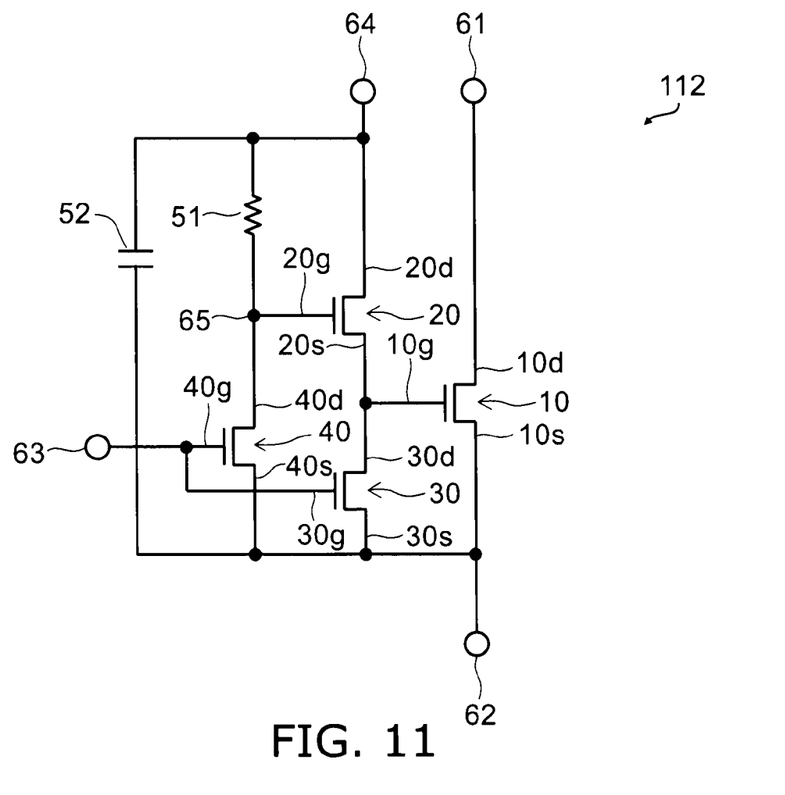
FIG. 11 is a circuit diagram illustrating the configuration of the nitride semiconductor device according to the second embodiment.

FIG. 11 is a circuit diagram illustrating the configuration of the nitride semiconductor device according to the second embodiment.

As illustrated in FIG. 10 and FIG. 11, the nitride semiconductor device 112 according to the embodiment is further provided with a capacitor 52 in addition to the first to fourth transistors 10, 20, 30, and 40 and the resistor 51 in the above. The other configurations can be the same as those in the nitride semiconductor device 111, and description will be omitted.

One end of the capacitor 52 is electrically connected to the second drain 20d and the above-mentioned one end of the resistor 51. The other end of the capacitor 52 is electrically connected to the first source 10s, the third source 30s, and the fourth source 40s.

An electric charge required for driving of a gate signal of the first transistor 10 is supplied from the capacitor 52. That is, by providing the capacitor 52, the first transistor 10 can be driven at a higher speed.

Also, the capacitor 52 levels a driving load current when seen from the power supply that supplies electricity to the nitride semiconductor device 112. Thus, an external capacitor can be omitted, and the influence of wiring inductance can be suppressed.

By setting the capacity of the capacitor 52 to input capacity or more of the first transistor 10, the capacitor works more effectively. More specifically, the capacity of the capacitor 52 is set to input capacity or more at the threshold voltage of the first transistor 10.

The capacity of the capacitor 52 may be large. However, if the capacity is set to an excessive value, the area of the capacitor 52 is increased, and a cost is raised. Also, it causes lowered yield and lowered breakdown voltage. Therefore, the capacity of the capacitor 52 is desirably set to approximately 100 times or less of the input capacity at the threshold voltage of the first transistor 10.

The capacitor 52 is formed by a lamination structure of a metal or highly conductive polysilicon and an insulating film, for example. Also, the capacitor 52 may include the two-dimensional electron gas 70b, for example, as will be described later.

For the insulating film included in the capacitor 52, at least any one selected from the group consisting of $SiO_2$, SiN, $Al_2O_3$, $TiO_2$, $BaTiO_3$, $SrTiO_3$, $(Ba, Sr)TiO_3$, $Ta_2O_5$, $LiTaO_3$, $HfO_2$, and $ZrO_2$. The embodiment is not limited to that, and any material can be used for the insulating film.

Figure 12:
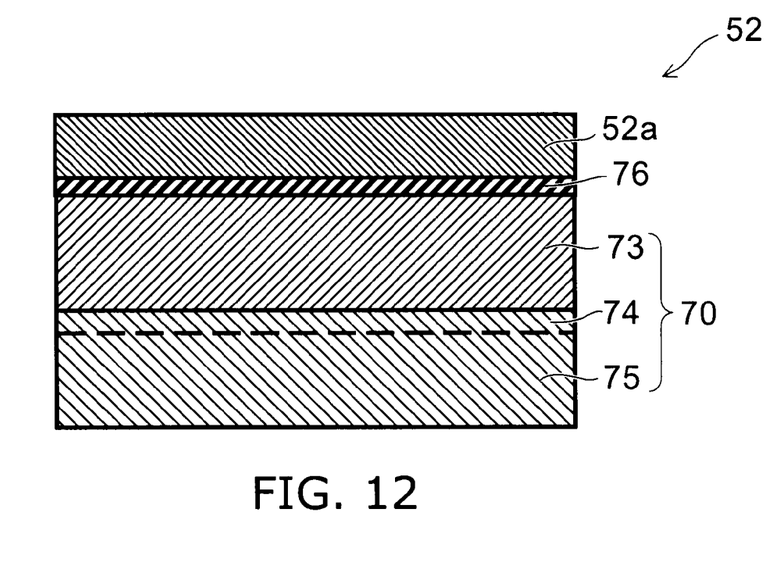
FIG. 12 is a schematic sectional view illustrating the configuration of a part of the nitride semiconductor device according to the second embodiment.

FIG. 12 is a schematic sectional view illustrating a configuration of a part of the nitride semiconductor device according to the second embodiment.

That is, the figure illustrates the configuration of the capacitor 52.

As illustrated in FIG. 12, an insulating film 76 is provided on the second layer 73 of the nitride semiconductor layer 70, and a capacitor electrode 52a is provided on the insulating film 76.

The two-dimensional electron gas channel 74 is electrically connected to the source electrode pad 62 or the power-supply electrode pad 64 through ohmic contact. The capacitor electrode 52a is electrically connected to the source electrode pad 62 or the power-supply electrode pad 64.

By using such a structure, a capacitor having a parallel flat-plate shape is formed by the two-dimensional electron gas channel 74 and the capacitor electrode 52a. However, this configuration is an example, and the embodiment is not limited to that. The configuration of the capacitor 52 is arbitrary.

In the embodiment, an example of the configuration of the nitride semiconductor device 112 is described by using FIG. 10, but the layout of elements included in the nitride semiconductor device 112 is not limited to the example illustrated in FIG. 10 but arbitrary.

According to the embodiment, a nitride semiconductor device with a smaller demand for a diving circuit and which can be used easily and operates at a high speed is provided.

Some embodiments of the invention have been described by referring to the specific examples. However, the embodiments of the invention are not limited to these specific examples. For example, one skilled in the art may similarly practice the invention by appropriately selecting specific configurations of components included in the nitride semiconductor device such as transistors, resistors, capacitors and the like from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductor devices practicable by an appropriate design modification by one skilled in the art based on the nitride semiconductor devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A nitride semiconductor device, comprising:
    a first transistor of n-type channel having a first gate, a first source, and a first drain and including a nitride semiconductor;
    a second transistor of n-type channel having a second gate, a second source electrically connected to the first gate, and a second drain, the second transistor including a nitride semiconductor;

a third transistor of n-type channel having a third gate, a third source electrically connected to the first source, and a third drain electrically connected to the first gate and the second source, the third transistor including a nitride semiconductor;

a fourth transistor of n-type channel having a fourth gate electrically connected to the third gate, a fourth source electrically connected to the first source and the third source, and a fourth drain electrically connected to the second gate, the fourth transistor including a nitride semiconductor;

a resistor having one end electrically connected to the second drain and one other end electrically connected to the second gate and the fourth drain;

a drain electrode pad electrically connected to the fourth drain;

a source electrode pad electrically connected to the first source, the third source and the fourth source;

a gate electrode pad electrically connected to the fourth gate and the third gate; and a power-supply electrode pad electrically connected to the second drain and the one end of the resistor.

2. The device according to claim 1, wherein
a ratio of an area of an active portion of the second transistor to an area of an active portion of the first transistor, a ratio of an area of an active portion of the third transistor to the area of the active portion of the first transistor, and a ratio of an area of an active portion of the fourth transistor to the area of the active portion of the first transistor are $5 \times 10^{-5}$ or more and $5 \times 10^{-1}$ or less.

3. The device according to claim 2, wherein
the area of the active portion of the fourth transistor is not more than the area of the active portion of the second transistor and not more than the area of the active portion of the third transistor.

4. The device according to claim 1, wherein
a ratio of an area of an active portion of the second transistor to an area of an active portion of the first transistor and a ratio of an area of an active portion of the fourth transistor to the area of the active portion of the first transistor are $5 \times 10^{-5}$ or more and $5 \times 10^{-1}$ or less.

5. The device according to claim 1, wherein
a ratio of an area of an active portion of the third transistor to an area of an active portion of the first transistor is $5 \times 10^{-1}$ or less.

6. The device according to claim 1, further comprising:
a nitride semiconductor layer,
each of channels included in each of the first, second, third, and fourth transistors being provided inside the nitride semiconductor layer.

7. The device according to claim 1, further comprising:
a substrate having a heterojunction,
the first, second, third, and fourth transistors being provided on the substrate.

8. The device according to claim 1, further comprising:
a nitride semiconductor layer including:
a first layer made of GaN; and
a second layer provided on the first layer and made of $In_xAl_yGa_{1-x-y}N$ ($0 \leq x<1$, $0<y<1$),
the resistor including a part of the nitride semiconductor layer.

9. The device according to claim 8, wherein
the resistor includes a recess provided in the second layer.

10. The device according to claim 1, wherein
the resistor includes a two-dimensional electron gas.

11. The device according to claim 1, further comprising:
a conductive portion electrically connected to the second gate, the fourth drain and the one other end of the resistor.

12. The device according to claim 1, wherein
the power-supply electrode pad is applied with a voltage of an absolute value of 3 volts or more and 20 volts or less.

13. The device according to claim 1, further comprising:
a capacitor having one end electrically connected to the second drain and the one end of the resistor and having one other end electrically connected to the first source, the third source, and the fourth source.

14. The device according to claim 13, further comprising:
a nitride semiconductor layer including:
a first layer made of GaN; and
a second layer provided on the first layer and made of $In_xAl_yGa_{1-x-y}N$ ($0 \leq x<1$, $0<y<1$),
the capacitor including a part of the nitride semiconductor layer.

15. The device according to claim 14, wherein the capacitor includes:
an insulating film provided on the second layer; and
a capacitor electrode provided on the insulating film.

16. The device according to claim 15, wherein
the insulating film includes at least one selected from the group consisting of $SiO_2$, SiN, $Al_2O_3$, $TiO_2$, $BaTiO_3$, $SrTiO_3$, $(Ba,Sr)TiO_3$, $Ta_2O_5$, $LiTaO_3$, $HfO_2$ and $ZrO_2$.

17. The device according to claim 13, wherein
the capacitor includes a two-dimensional electron gas.

18. The device according to claim 13, wherein
the capacitor has a capacity not less than an input capacity at a threshold voltage of the first transistor.

19. The device according to claim 18, wherein
the capacity of the capacitor is not more than 100 times the input capacity at the threshold voltage of the first transistor.

* * * * *